US006691196B2

(12) United States Patent
Mills et al.

(10) Patent No.: US 6,691,196 B2
(45) Date of Patent: *Feb. 10, 2004

(54) FIRST-LEVEL REMOVABLE MODULE HAVING BAR CODE I/O AND SECOND-LEVEL REMOVABLE MEMORY

(75) Inventors: Kevin J. Mills, Palo Alto, CA (US); Micheal L. Gifford, San Leandeo, CA (US)

(73) Assignee: Socket Communications, Inc., Newark, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/036,468

(22) Filed: Jan. 7, 2002

(65) Prior Publication Data

US 2002/0169912 A1 Nov. 14, 2002

Related U.S. Application Data

(63) Continuation of application No. 09/309,373, filed on May 11, 1999, now Pat. No. 6,353,870.

(51) Int. Cl.[7] .............................. G06F 13/00; G06F 1/16
(52) U.S. Cl. ........................ 710/301; 710/2; 711/115; 361/684; 361/686
(58) Field of Search ................. 710/300–304, 710/2; 361/679–686; 711/115

(56) References Cited

U.S. PATENT DOCUMENTS

| | | | |
|---|---|---|---|
| 4,744,006 A | 5/1988 | Duffield | 361/686 |
| 5,049,728 A | 9/1991 | Rovin | 235/492 |
| 5,184,282 A | 2/1993 | Kaneda et al. | 361/737 |
| 5,291,584 A | 3/1994 | Challa et al. | 395/500 |
| 5,491,774 A | 2/1996 | Norris et al. | 395/2.79 |
| 5,519,577 A | 5/1996 | Dudas et al. | 361/737 |
| 5,545,057 A | 8/1996 | Tan et al. | 439/540.1 |
| 5,550,709 A | 8/1996 | Iwasaki | 361/684 |

(List continued on next page.)

OTHER PUBLICATIONS

*MultiMediaCard System Summay Version 2.0*, MMCA, Jan. 1999.
Wes Brewer, *Smart Solutions for Smart Phones*, SanDisk Corporation, 1998.
*CompactFlash Specification Revision 1.3*, CompactFlash Association, 1998.
*PC Cards and CompactFlash Size CF+Cards for Ethernet, Serial Communications, Bar Code Scanning and Data Collection*, Socket Communications, Inc., 1998.
*ScanDisk CompatFlash*SanDisk Corporation, Apr. 1998.
*SanDisk MultiMediaCard*, SanDisk Corporation, Nov. 1997.
Apr. 30, 2001 PCT Written Opinion for related International application No. PCT/US00/12796, filed May 9, 2000.

*Primary Examiner*—Sumati Lefkowitz
(74) *Attorney, Agent, or Firm*—PatentVentures; Bennett Smith; Korbin Van Dyke

(57) ABSTRACT

Computer hosts, such as PDAs, are customized for use in bar code scanner applications through use of a first-level removable expansion module having bar code related circuitry and a slot and internal connector for a second-level removable memory. In combination with a connected or attached I/O device for scanning bar codes, these modules provide embedded bar code scanning I/O adapter and/or application-specific functions as well as second-level removable memory functions. The removable memory may be used to store a backup copy of the scanned data for restoration in the event the original scan data is lost or corrupted. Restoration may occur using any interface compatible with the removable memory. The removable memory may also be used by the bar code scanner application specific circuitry within the first-level removable expansion module. In illustrative embodiments, an industry standard physical and electrical interface couples the application specific module to the computer host, which provides user interface functions for the application.

44 Claims, 15 Drawing Sheets

U.S. PATENT DOCUMENTS

| | | | |
|---|---|---|---|
| 5,563,400 A | 10/1996 | Le Roux | 235/486 |
| 5,566,290 A | 10/1996 | Silverbrook | 395/173 |
| 5,579,430 A | 11/1996 | Grill et al. | 395/2.12 |
| 5,611,055 A | 3/1997 | Krishan et al. | 710/101 |
| 5,611,057 A | 3/1997 | Pecone et al. | 710/102 |
| 5,615,344 A | 3/1997 | Corder | 710/129 |
| 5,619,396 A | 4/1997 | Gee et al. | 361/686 |
| 5,661,635 A | 8/1997 | Huffman et al. | 361/684 |
| 5,663,901 A | 9/1997 | Wallace et al. | 365/52 |
| 5,671,374 A | 9/1997 | Postman et al. | 395/309 |
| 5,675,734 A | 10/1997 | Hair | 395/200.01 |
| 5,679,007 A | 10/1997 | Potdevin et al. | 439/76.1 |
| 5,752,857 A | 5/1998 | Knights | 439/638 |
| 5,818,030 A | 10/1998 | Reyes | 235/492 |
| 5,839,108 A | 11/1998 | Daberko et al. | 704/270 |
| 5,876,218 A | 3/1999 | Liebenow et al. | 439/74 |
| 5,887,145 A | 3/1999 | Harari et al. | 395/282 |
| 5,892,213 A | 4/1999 | Ito et al. | 235/441 |
| 5,906,516 A | 5/1999 | Sato et al. | 439/630 |
| 5,928,347 A | 7/1999 | Jones | 710/129 |
| 5,933,328 A | 8/1999 | Wallace et al. | 257/678 |
| 6,002,605 A | 12/1999 | Iwasaki et al. | 365/51 |
| 6,053,748 A | 4/2000 | Bricaud et al. | 439/76.1 |
| 6,085,412 A | 7/2000 | Iwasaki | 29/827 |
| 6,091,137 A | 7/2000 | Fukuda | 257/679 |
| 6,097,605 A | 8/2000 | Klatt et al. | 361/737 |
| 6,102,714 A | 8/2000 | Oliphant et al. | 439/131 |
| 6,222,726 B1 | 4/2001 | Cha | 361/683 |
| 6,293,464 B1 | 9/2001 | Smalley, Jr. | 235/435 |

(Prior Art)

(Prior Art)

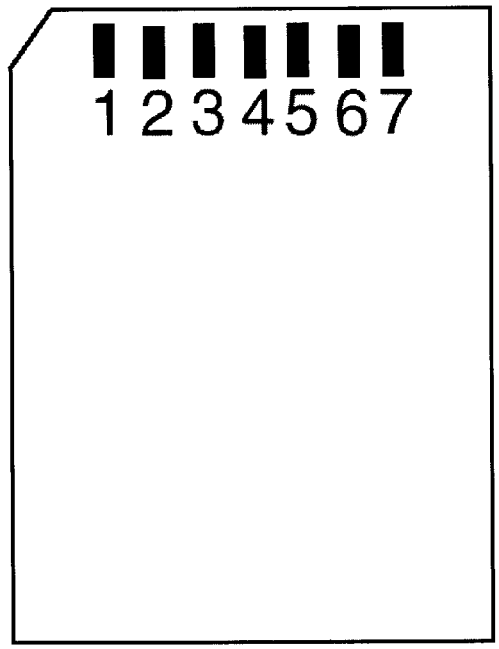

Figure 2A (Prior Art)

MultiMediaCard pad definition

| Pin No. | Name | Type[1] | Description |
|---|---|---|---|
| 1 | RSV | NC | Reserved for future use |
| 2 | CMD | I/O/PP/OD | Command/Response |
| 3 | $V_{SS1}$ | S | Supply voltage ground |
| 4 | $V_{DD}$ | S | Supply voltage |
| 5 | CLK | I | Clock |
| 6 | $V_{SS2}$ | S | Supply voltage ground |
| 7 | DAT[2] | I/O/PP | Data |

1)S: power supply; I: input; O: output; PP: push-pull; OD: open-drain; NC: Not connected (or logical high)
2)The DAT line for read-only cards is output only

Figure 2B (Prior Art)

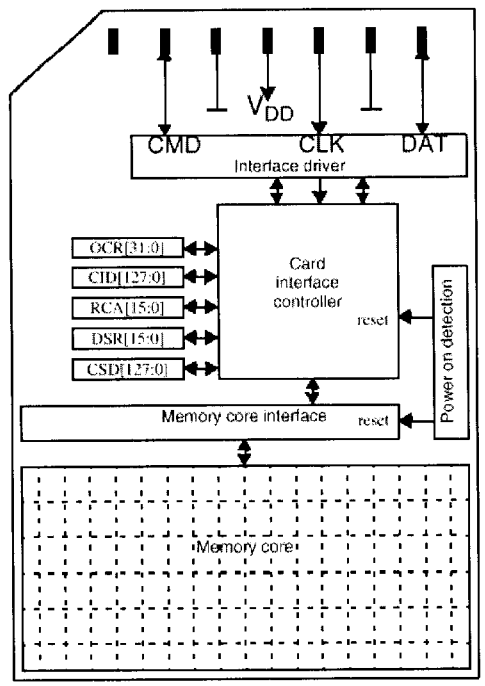

Figure 3A (Prior Art)

MultiMediaCard registers

| Name | Width | Description |
|------|-------|-------------|
| CID | 128 | Card identification number, card individual number for identification. Mandatory. |
| RCA | 16 | Relative card address, local system address of a card, dynamically assigned by the host during initialization. Mandatory. |
| DSR | 16 | Driver stage register to configure the card's output drivers. Optional. |
| CSD | 128 | Card specific data, information about the card operation conditions. Mandatory |
| OCR | 32 | Operation condition register for cards which do not support the full voltage range. Used by a special broadcast command to detect restricted cards. Optional. |

Figure 3B (Prior Art)

(Prior Art)
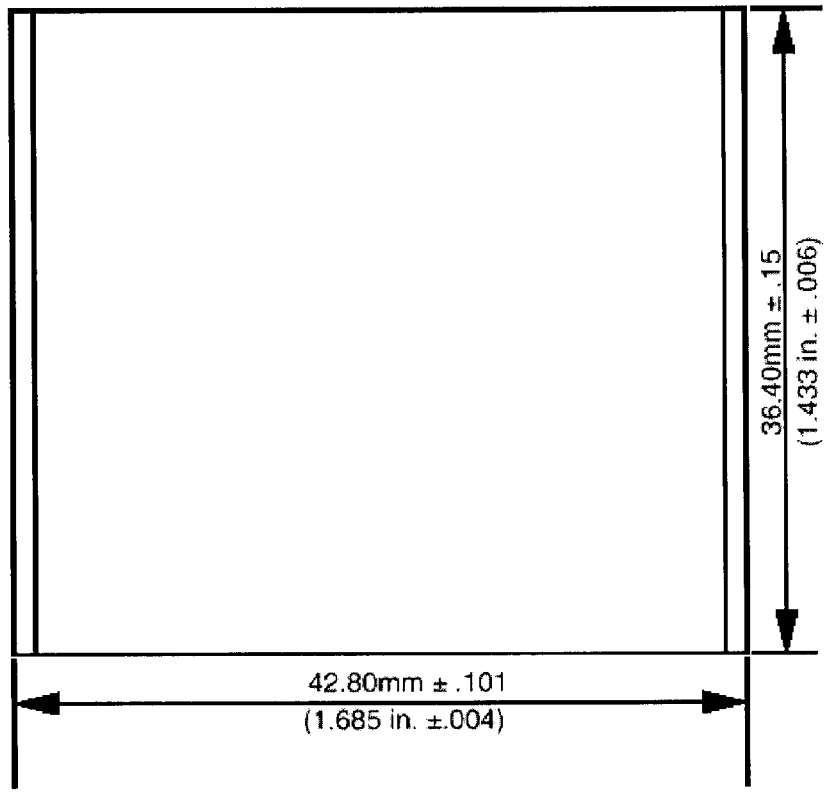
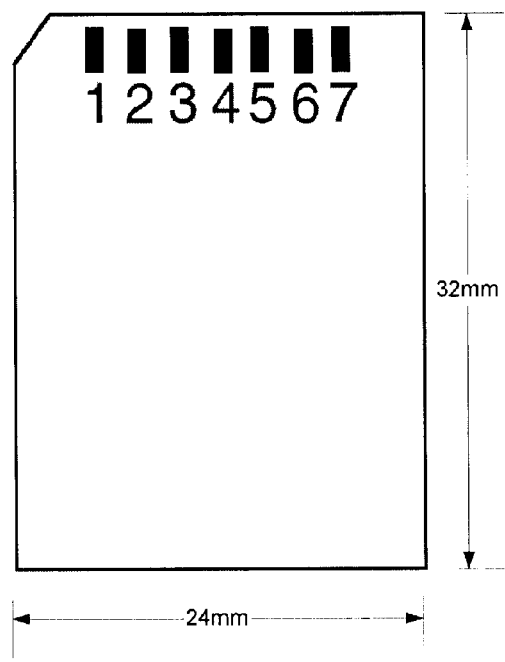
Figure 6A (Prior Art)

ized as a costly and nonviable solution.
FIRST-LEVEL REMOVABLE MODULE HAVING BAR CODE I/O AND SECOND-LEVEL REMOVABLE MEMORY This application is a continuation of application Ser. No. 09/309,373 filed May 11, 1999 now U.S. Pat. No. 6,353,870.

FIELD

The invention is related to closed-case removable expansion cards for computer hosts, such cards having particular application to portable computer hosts such as handheld computing devices.

BACKGROUND

The broad use of portable host computers, including Personal Digital Assistants (PDAs), has been severely hampered by limited capabilities for expansion or customization. Expansion and application customization has been performed via only one, or at most two, slots for removable expansion cards for I/O, I/O adapters, memories, and memory adapters. Memory expansion cards have included DRAM, SRAM, ROM, and Flash technologies. I/O expansion cards have included dedicated peripherals, networking, modems, wireless communications, serial I/O, and bar-code and other scanners.

Having only one slot meant choosing between memory or peripheral expansion. In two-slot implementations, one of the slots is generally used for peripheral expansion, and the other for memory expansion. As market forces and consumer demand are pushing future PDAs to be ever smaller, allocating packaging volume for two-slots will be increasingly viewed as a costly and nonviable solution.

Memory and Expansion Card Standards

Two of the most popular industry standards for the slots and removable cards are the PC Card and the CompactFlash Card. The PC Card has a 16-bit variant, previously known as a PCMCIA card, and a newer 32-bit variant, also known as a Card-Bus card. U.S. Pat. No. 5,815,426 ('426), ADAPTER FOR INTERFACING AN INSERTABLE/REMOVABLE DIGITAL MEMORY APPARATUS TO A HOST DATA PART, assigned to Nexcom Technology, and hereby incorporated by reference, describes these and other removable expansion card and memory types suitable for PDAs. In addition to the PC Card and CompactFlash Card formats, the '426 patent includes discussions of and references to Miniature Cards, Sold State Floppy Disk Cards (SSFDCs), MultiMediaCards (MMC), Integrated Circuit (IC) Cards (also known as Smart Cards), and Subscriber Identification Module (SIM) Cards.

CompactFlash Card

FIGS. 1A, 1B, and 1C are different views of a prior art Type II CompactFlash Card. The CompactFlash physical, electrical, and software interface architecture is taught in the CompactFlash Specification Revision 1.3, Copyright 1998, by the CompactFlash Association, P.O. Box 51537, Palo Alto, Calif. 94303, which is hereby incorporated by reference. FIGS. 1A, 1B, 1C, part of 6A, and part of 6B are reproduced or derived from the CompactFlash Specification document.

U.S. Pat. No. 5,887,145 ('145), REMOVABLE MOTHER/DAUGHTER PERIPHERAL CARD, assigned to SanDisk Corporation, and hereby incorporated by reference, describes the required features of host systems for CompactFlash Cards, including controllers required by CompactFlash memory cards (CF cards) and comprehensive controllers required by CompactFlash memory and I/O cards (CF+cards).

MultiMediaCard

FIGS. 2A and 2B represent a prior art MultiMediaCard form factor and its pad definitions. FIGS. 3A and 3B represent the prior art internal architecture of a generic MultiMediaCard and its registers. FIG. 4 illustrates the prior art functional partitioning of a generic MultiMediaCard system. FIG. 5 illustrates the prior art physical partitioning of a generic MultiMediaCard system. The MMC and MMC related system issues are taught in the MultimediaCard System Summary Version 2.0, Copyright January 1999, by the MultiMediaCard Association, 19672 Stevens Creek Blvd., #404, Cupertino, Calif. 95014-2465, which is hereby incorporated by reference. FIGS. 2A, 2B, 3A, 3B, 4, 5, and part of 6A are reproduced or derived from the MultimediaCard System Summary document.

FIGS. 6A and 6B are different views comparing the form factors of the prior art CompactFlash Card (top) and MultiMediaCard (bottom). In each of 6A and 6B, the CompactFlash Card and the MultiMediaCard are both roughly to equal scale.

Adapters for Removable Memories

Adapters exist or have been prophetically disclosed for physically and electrically coupling a removable memory on a slide, or stick, to a portable host via a removable expansion card of either the PCMCIA Card or CompactFlash Card form factors. The previously mentioned '426 patent describes such removable memory adapters. The focus of these existing memory adapters has been limited to merely providing an interface adapter, or bridge, between a first interface type (the host to removable-expansion-card interface) and a second interface type (the removable memory stick).

PC Card Mother and CompactFlash Card Daughter Combinations

Adapters exist or have been prophetically disclosed that comprise a special mother PC Card designed to accept one or more daughter CompactFlash Cards of one or more types. The previously '145 patent describes such CompactFlash adapters. The focus of these existing mother/daughter combinations has also been limited. First, the daughters have been used for memory expansion for the host platform, primarily in the form of flash-memory-based mass-storage-like devices. In this first approach, the mother card provides the requisite mass-storage controller functionality. Second, the daughters have been used for dedicated peripheral, I/O, or communication functions. In this second approach, the mother card has a so-called comprehensive controller that augments the mass-storage controller functionality with functions commonly required or useful to multiple daughter cards. Third, in a variation of either of the first two paradigms, functions of the general-purpose host may be relocated to the mother card.

Background for PC-Card Based I/O Functions

Techniques are known in the art for making and using systems that perform such I/O functions in a PC card. For example, see U.S. Pat. No. 5,671,374 ('374), PCMCIA INTERFACE CARD COUPLING INPUT DEVICES SUCH AS BARCODE SCANNING ENGINES TO PERSONAL DIGITAL ASSISTANTS AND PALMTOP COMPUTERS, assigned to TPS Electronics, which is hereby incorporated by reference. The '374 patent teaches the use of PDAs and similar hosts equipped with PC card interfaces for I/O devices including portable laser-scanners, magnetic stripe and ink readers, keyboards and keypads, OCR devices, and trackballs.

Techniques are also known in the art for making and using PC Card-based radios for applications based in a portable host. For example, see U.S. Pat. No. 5,519,577 ('577), SPREAD SPECTRUM RADIO INCORPORATED IN A PCMCIA TYPE II CARD HOLDER, assigned to Symbol Technologies, and hereby incorporated by reference.

Techniques are also known in the art for making and using disk emulation devices based on flash memory. For example, see U.S. Pat. No. 5,291,584 ('584), METHODS AND APPARATUS FOR HARD DISK EMULATION, assigned to Nexcom Technology, and hereby incorporated by reference.

Background for Relevant Application Specific Functions

Techniques are known in the art for making and using systems that download or capture compressed digital audio for storage and later playback using dedicated removable media. For example, U.S. Pat. No. 5,676,734 ('734), SYSTEM FOR TRANSMITTING DESIRED DIGITAL VIDEO OR AUDIO SIGNALS, assigned to Parsec Sight/Sound, and hereby incorporated by reference, teaches a system for transmitting digital video or audio signals over a telecommunications link from a first to a second party. In addition, U.S. Pat. No. 5,579,430 ('430), DIGITAL ENCODING PROCESS, assigned to Fraunhofer Gesellschaft zur Foerderung der angewandten Forschung e.V., and hereby incorporated by reference, teaches processes for encoding digitized analog signals. Such processes are useful for insuring high-quality reproduction while reducing transmission bandwidth and data storage requirements.

Techniques are also known in the art for making and using record and playback portable host devices based on a dedicated flash memory. For example, see U.S. Pat. No. 5,491,774 ('774), HANDHELD RECORD AND PLAYBACK DEVICE WITH FLASH MEMORY, assigned to Comp General Corporation, and hereby incorporated by reference, and U.S. Pat. No. 5,839,108 ('108), FLASH MEMORY FILE SYSTEM IN A HANDHELD RECORD AND PLAYBACK DEVICE, assigned to Norris Communications, also hereby incorporated by reference.

Limitations of Previous Approaches

In general purpose portable hosts, populating an expansion slot has meant choosing one of either removable memory or peripheral expansion for that slot. When used for memory expansion, the removable memory has been limited to use for the system or application software running on the host. In essence, the removable memory has only been used as host-dedicated memory. This was done either directly, e.g., as some portion of the main-memory of the host, or indirectly as an emulation substitute for host mass-storage (i.e., disk drives).

When used for I/O expansion, the expansion I/O-cards have not had access to a private removable media/memory. This has prevented portable computer hosts, such as PDAs, from being used as a customizable platform for many application-specific functions that require a removable memory dedicated to the application.

SUMMARY

The utility of portable computer hosts, such as PDAs, is enhanced by methods and apparatus for closed-case removable expansion cards having a removable memory in both a first and second embodiment. In both the first and second embodiments the closed-case removable expansion cards preferably use a Type II CompactFlash form factor. In the first embodiment the removable memory is in combination with an external-I/O connector or permanently attached external-I/O device, providing both I/O and memory functions in a single closed-case removable expansion card. This increases the expansion functional density for portable computer hosts, such as PDAs. That is, it increases the amount of functionality that can be accommodated within a given volume allocation for expansion devices. It also provides a viable alternative to 2-slot implementations. In the second embodiment the removable memory is a private memory for application specific circuitry within the closed-case-removable expansion card. This enhances the utility of portable computer hosts, such as PDAs, as universal chassises for application specific uses. The standard CompactFlash physical and electrical interface couples the application specific card to the host, which provides user interface functions for the application. The cards include a top located slot and an internal connector for accepting a MultiMediaCard as the private removable memory. In addition, the application specific card will generally have some manner of I/O to required external devices, such as scanning devices, sensors, or transducers. Otherwise, all functionality for the application specific function is self-contained within the application specific card. Particular application specific cards for customizing general purpose PDAs via the instant invention include a media-player card for digitized media stored on removable memory and a bar-code-scanner card having scanning data stored on removable memory.

BRIEF DESCRIPTION OF DRAWINGS

FIGS. 2A and 2B represent a prior art MultiMediaCard form factor and its pad definitions.

FIGS. 3A and 3B represent the prior art internal architecture of a generic MultiMediaCard and its registers.

FIGS. 6A and 6B compares the form factors of the prior art CompactFlash card (top) and MultiMediaCard (bottom).

DETAILED DESCRIPTION

Components of the Expansion Card

Figure 9:
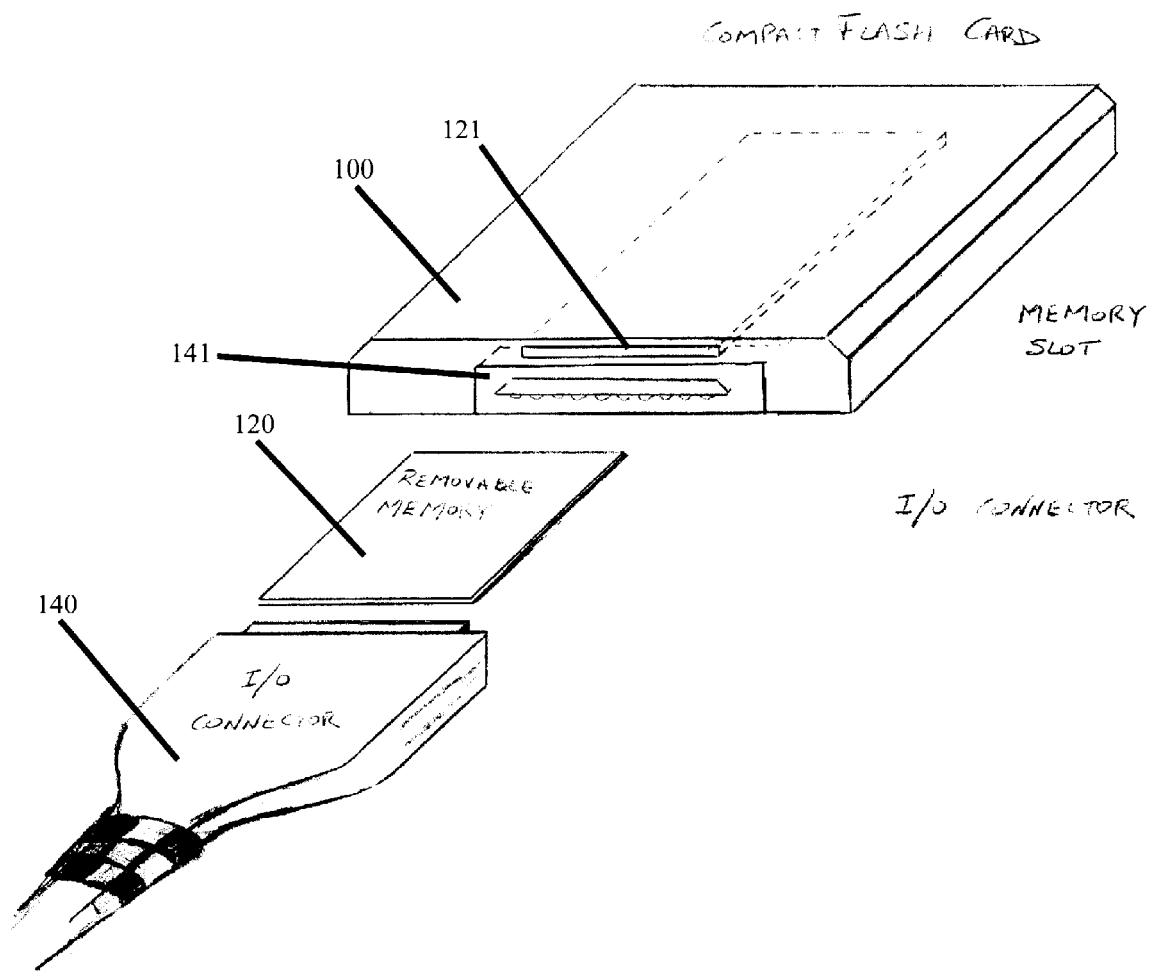
FIG. 9 is an abstract drawing representing the removable expansion card of FIG. 7 separate from the PDA, and with the I/O and memory disengaged from the removable expansion card.

FIG. 9 is an abstract drawing representing a closed-case removable expansion card 100, i.e., an expansion card that may be inserted into and removed out of a closed-case computer host. The card is especially suitable for use in a portable host, such as a PDA. In accordance with the present invention, the expansion card of FIG. 9 includes a connector 141 for I/O interconnect and a slot 121 for a removable memory. FIG. 9 shows the I/O interconnect 140 and removable memory 120 disengaged from the removable expansion card.

Figure 10:
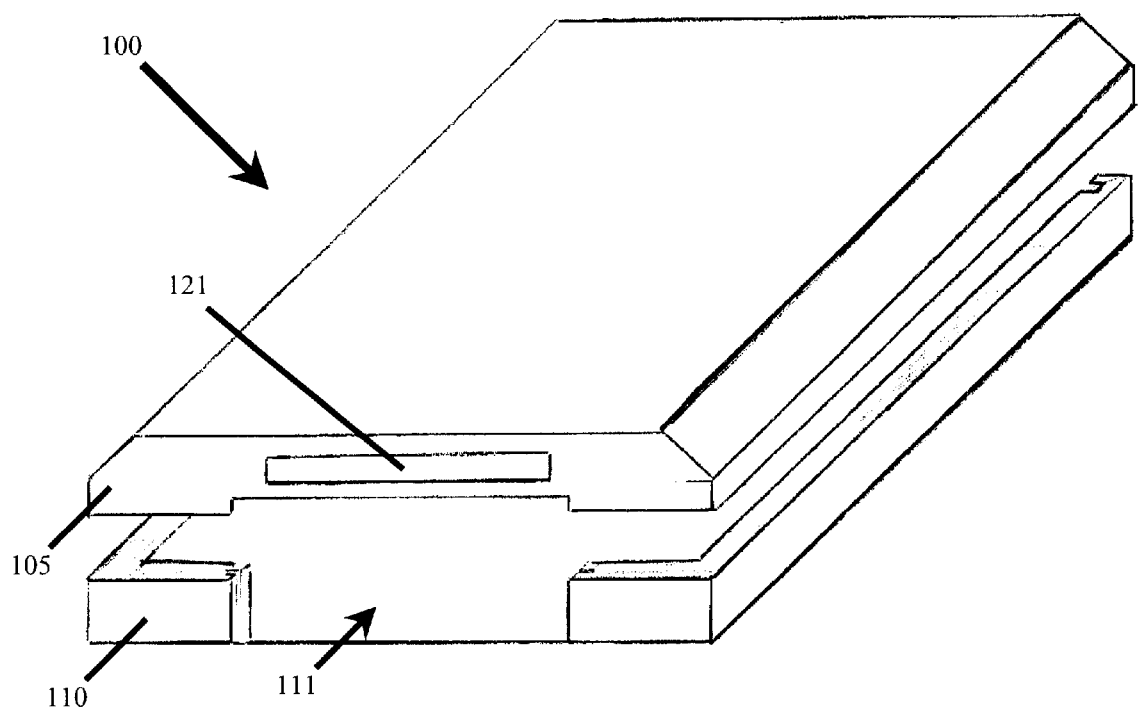
FIG. 10 is an abstract drawing representing the construction detail of the upper and lower frame of the removable expansion card of FIG. 7.

FIG. 10 is an abstract drawing representing the construction detail of the upper 105 and lower 110 frame members of the removable expansion card 100 of FIG. 9. An opening 111 is provided in the lower frame 110 for receiving the connector 141 for I/O interconnect.

Figure 11:
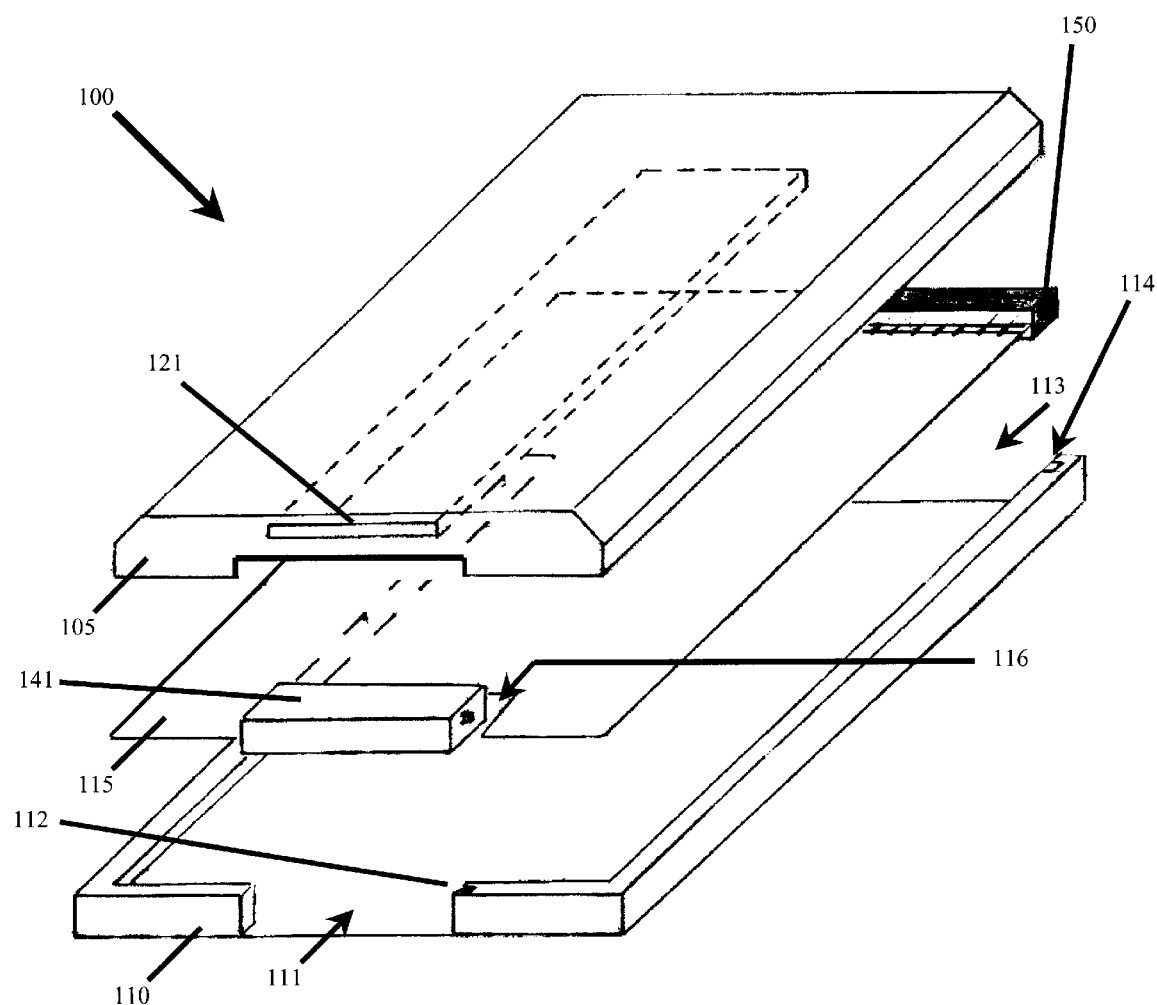
FIG. 11 is an abstract drawing representing an exploded view of the removable expansion card of FIG. 7, including the outer frame, inner PCB, and connectors.

FIG. 11 is an abstract drawing representing an exploded view of the removable expansion card 100 of FIG. 9, including the outer frame, inner PCB 115, and connectors. Visible for the first time in the view of FIG. 11, a second opening 113 is provided in the lower frame 110 for receiving the connector 150 for host interconnect. Additionally, a slot 112 is provided on both sides of the opening 111 to aid in the alignment and retention of the connector 141, and a slot 114 is provided on both sides of opening 113 to aid in the alignment and retention of the connector 150. An opening 116 is provided in the PCB for receiving the connector 141.

Figure 12A:
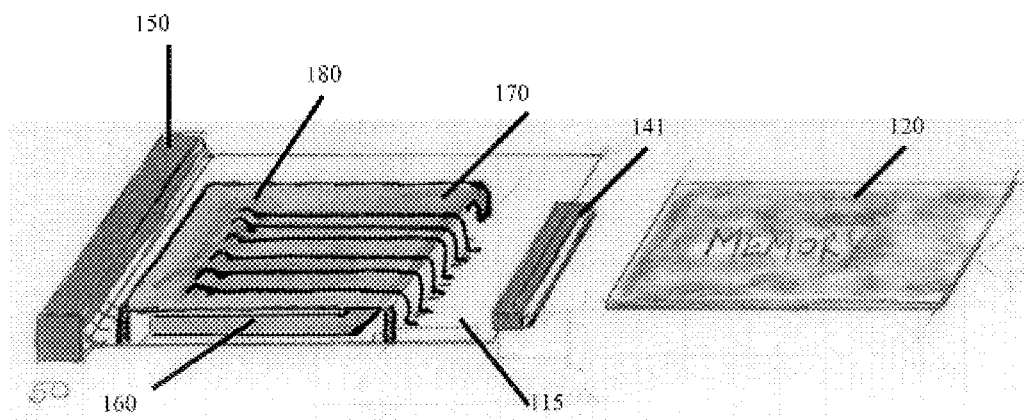
FIG. 12A is an abstract drawing representing a view of the removable expansion card of FIG. 7, with the outer frame removed, and a removable memory roughly aligned with the contact fingers to which it mates within the removable expansion card.

FIG. 12A is an abstract drawing representing a view of the removable expansion card 100 of FIG. 9, with the outer frame members removed, and a removable memory 120 roughly aligned with the contact fingers 180 to which it mates within the removable expansion card. Circuitry 160 is provided, including I/O adapter circuitry, removable memory adapter circuitry, and application-specific circuitry. A support shelf 170 supports, aligns, separates, and isolates the underside of the contact fingers 180 from the circuitry 160.

Figure 12B:
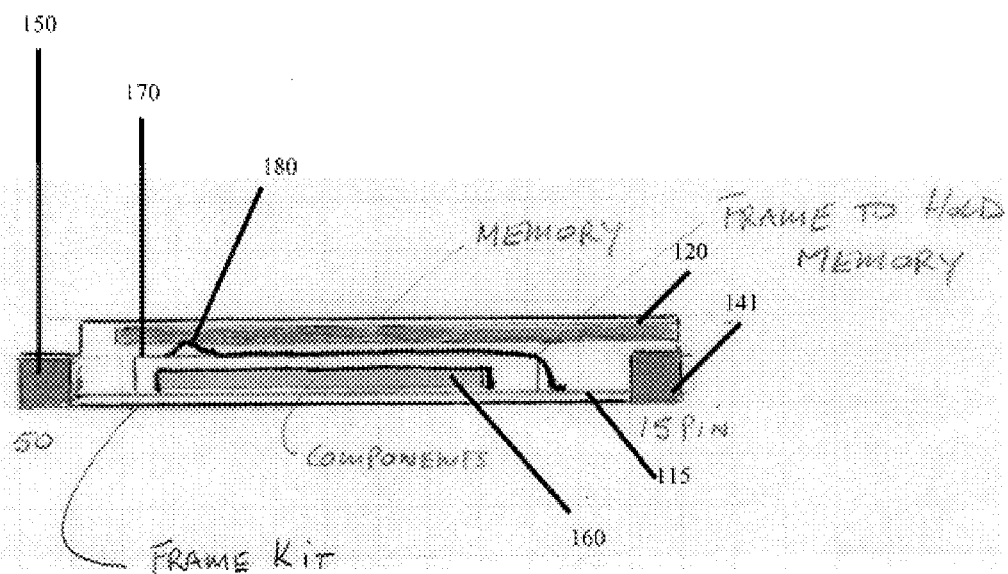
FIG. 12B is an abstract drawing representing a cut away side view of the removable expansion card of FIG. 7, with the removable memory inserted into the removable expansion card.

FIG. 12B is an abstract drawing representing a cut away side view of the removable expansion card 100 of FIG. 9, with the removable memory 120 inserted into the removable expansion card.

Figure 13A:
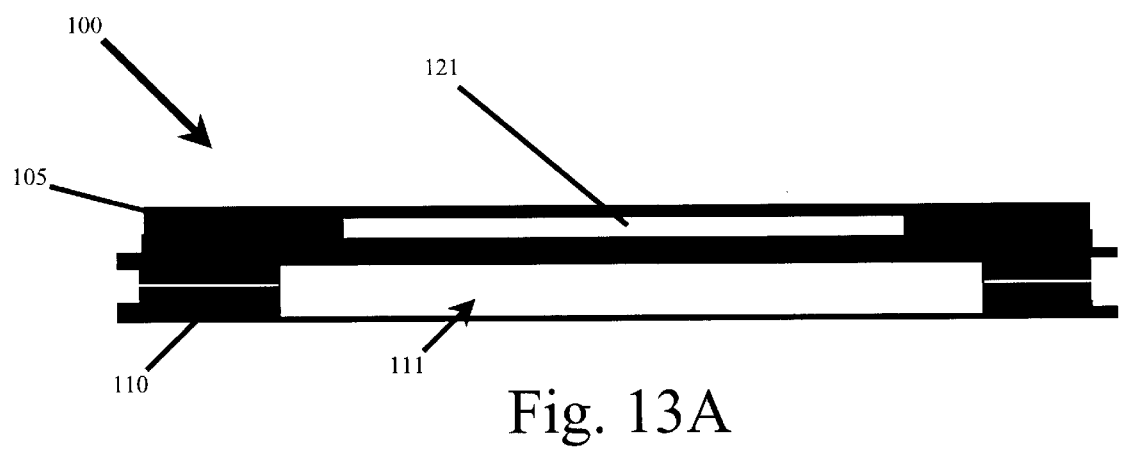
FIG. 13A is an abstract drawing representing an end view silhouette of the removable expansion card of FIG. 7.
Figure 13B:
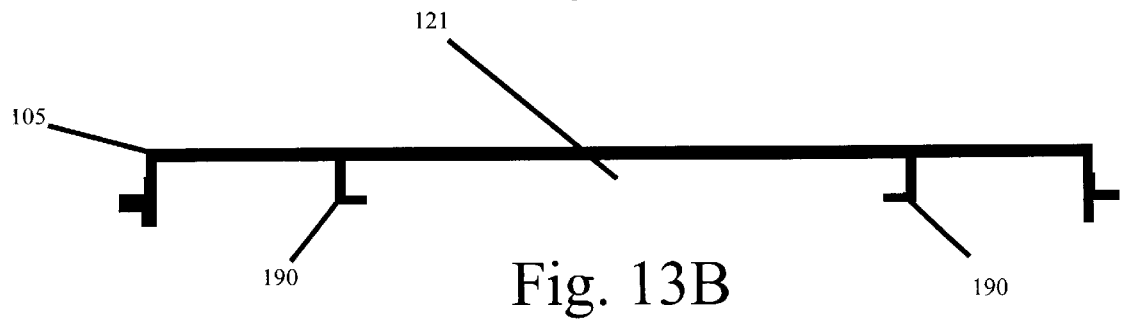
FIG. 13B is an abstract drawing representing a cross-sectional view silhouette of the upper frame member of the removable expansion card of FIG. 7.

FIG. 13A is an abstract drawing representing an end view silhouette of the removable expansion card 100 of FIG. 9. FIG. 13B is an abstract drawing representing a cross-sectional view silhouette of the upper frame member 105 of the removable expansion card 100 of FIG. 9. Guides 190 provide alignment and support for removable memory inserted via slot 121.

In a preferred embodiment, the expansion card 100 and associated host connector 150 are compatible with the Type II CompactFlash Card as described in the previously referenced CompactFlash Specification. The I/O connector 141 is compatible with a PC-Card industry standard Honda-style 15-pin connector. The slot 121, removable memory 120, and removable memory adapter circuitry of circuitry 160, are compatible with the MultiMediaCard as described in the previously referenced MultiMediaCard System Summary.

Circuitry on the Expansion Card

In a first embodiment of the invention, circuitry 160 includes I/O adapter circuitry and removable memory adapter circuitry. The I/O adapter functionality may include one or more of, but is not limited to, Ethernet, serial port, audio, telephone, antenna, and special-function interfaces such as bar code and other scanners. The removable memory adapter functionality may include one or more of, but is not limited to, main memory expansion, mass-media emulation, and other host-based special-purpose memory applications.

In accordance with a second embodiment, circuitry 160 further includes application-specific circuitry for which the management of the removable memory is an ancillary function to the primary function of the specific application. Specific examples of such application-specific expansion cards having both I/O and removable memory are provided in later sections.

Figure 1A:
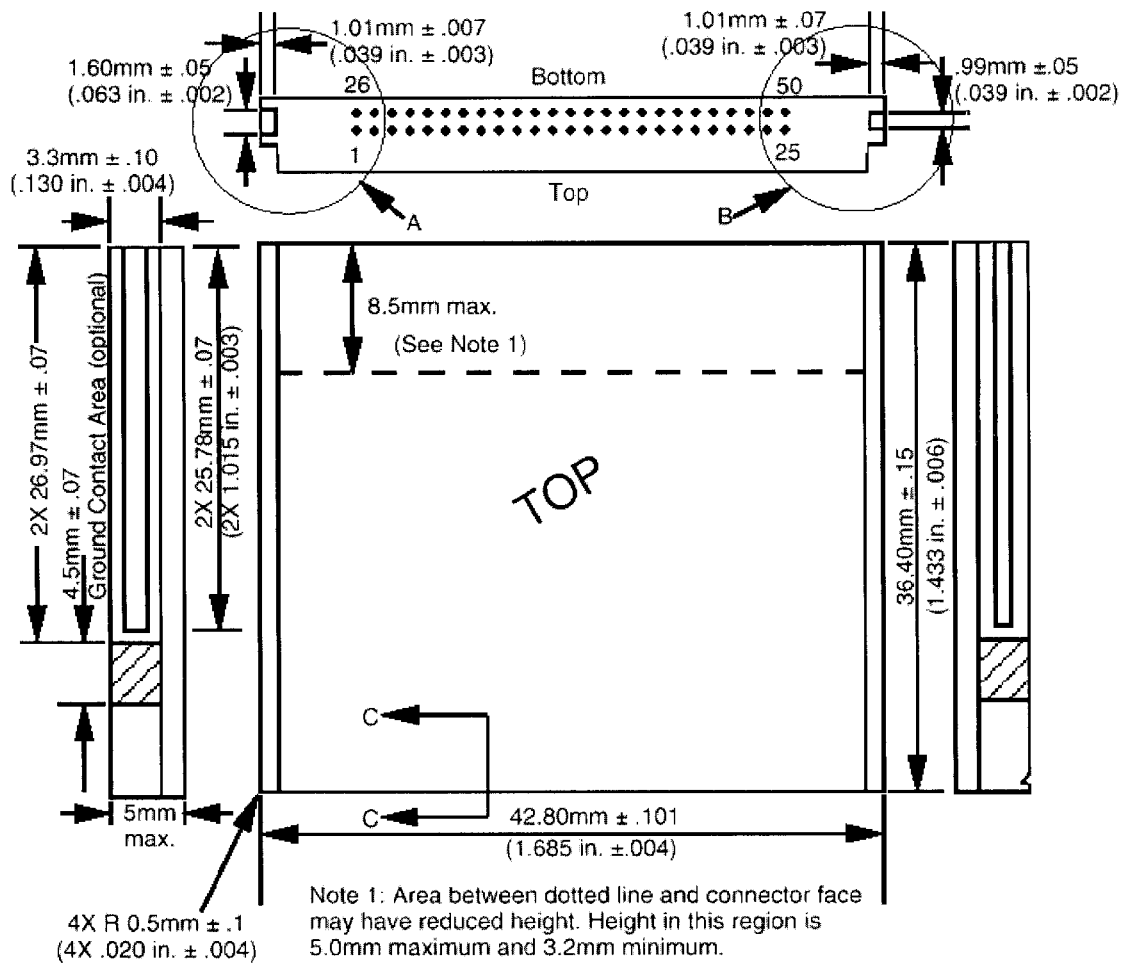
FIGS. 1A, 1B, and 1C are different views of a prior art Type II CompactFlash card.
Figure 1B:
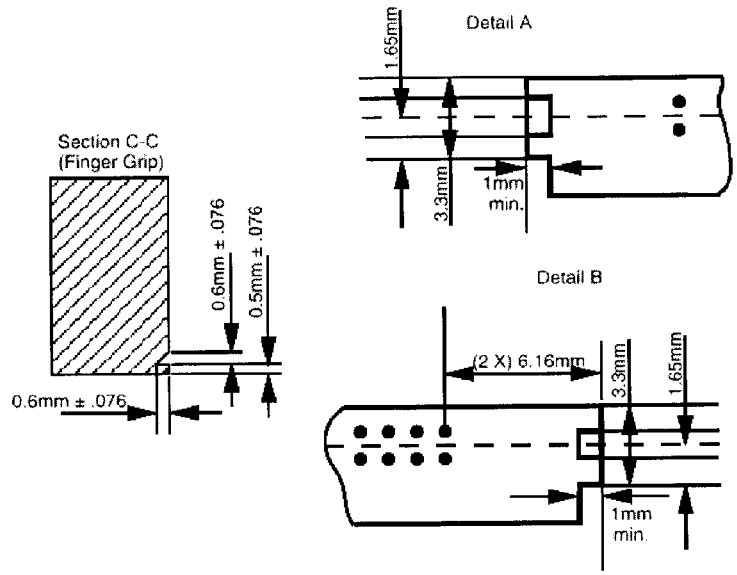
Figure 1C:
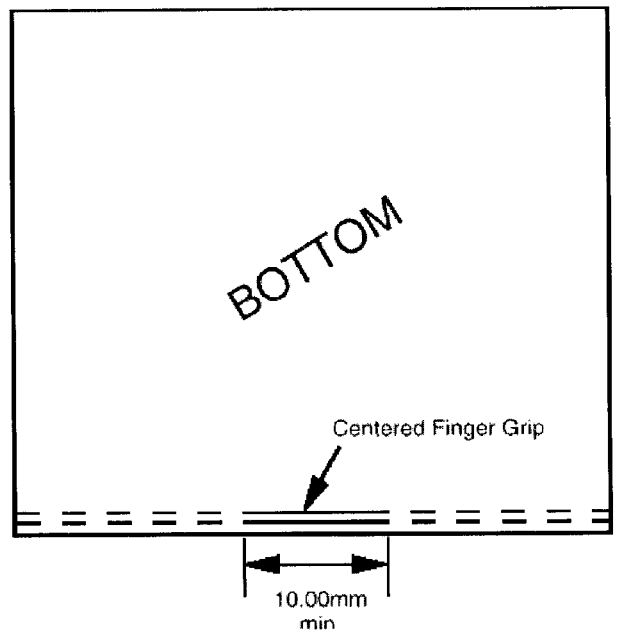
Figure 4:
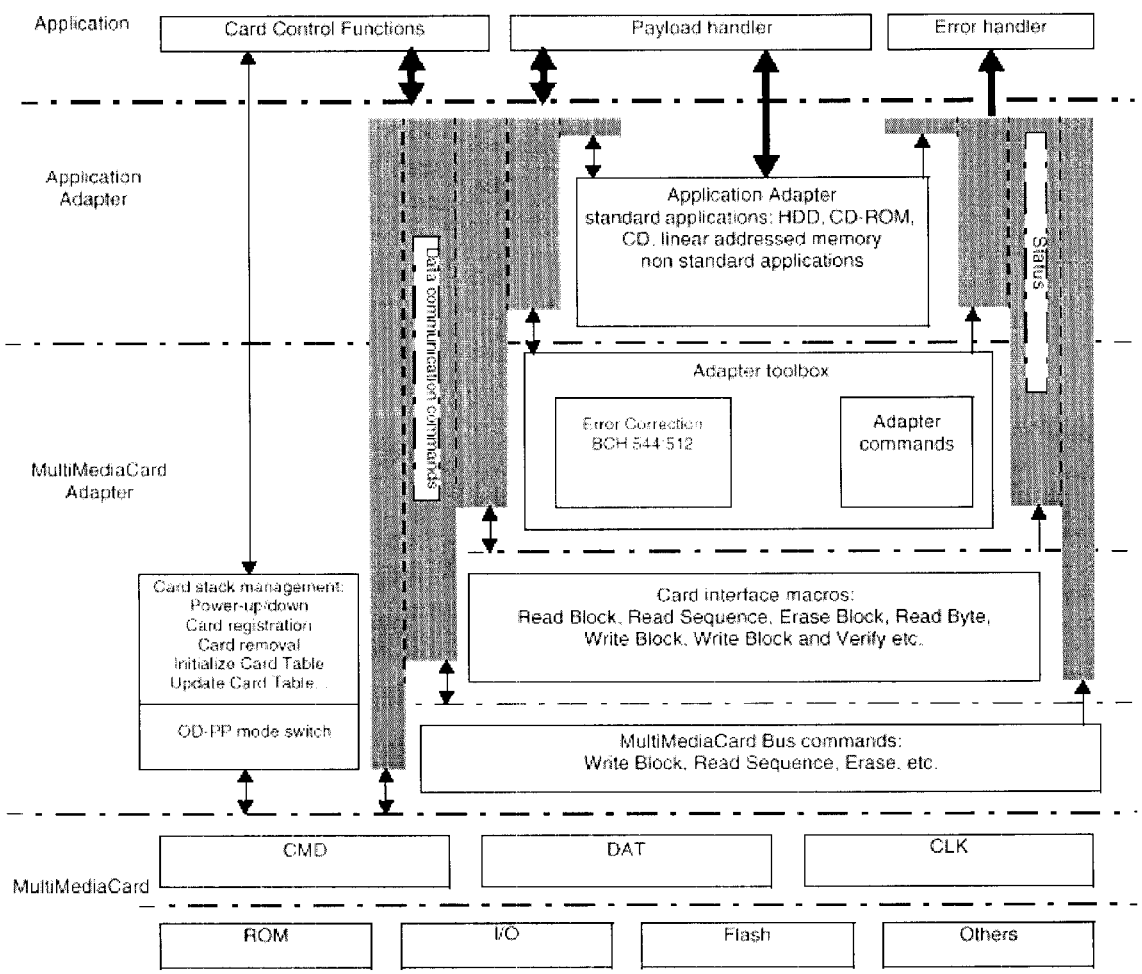
FIG. 4 illustrates the prior art functional partitioning of a generic MultiMediaCard system.
Figure 5:
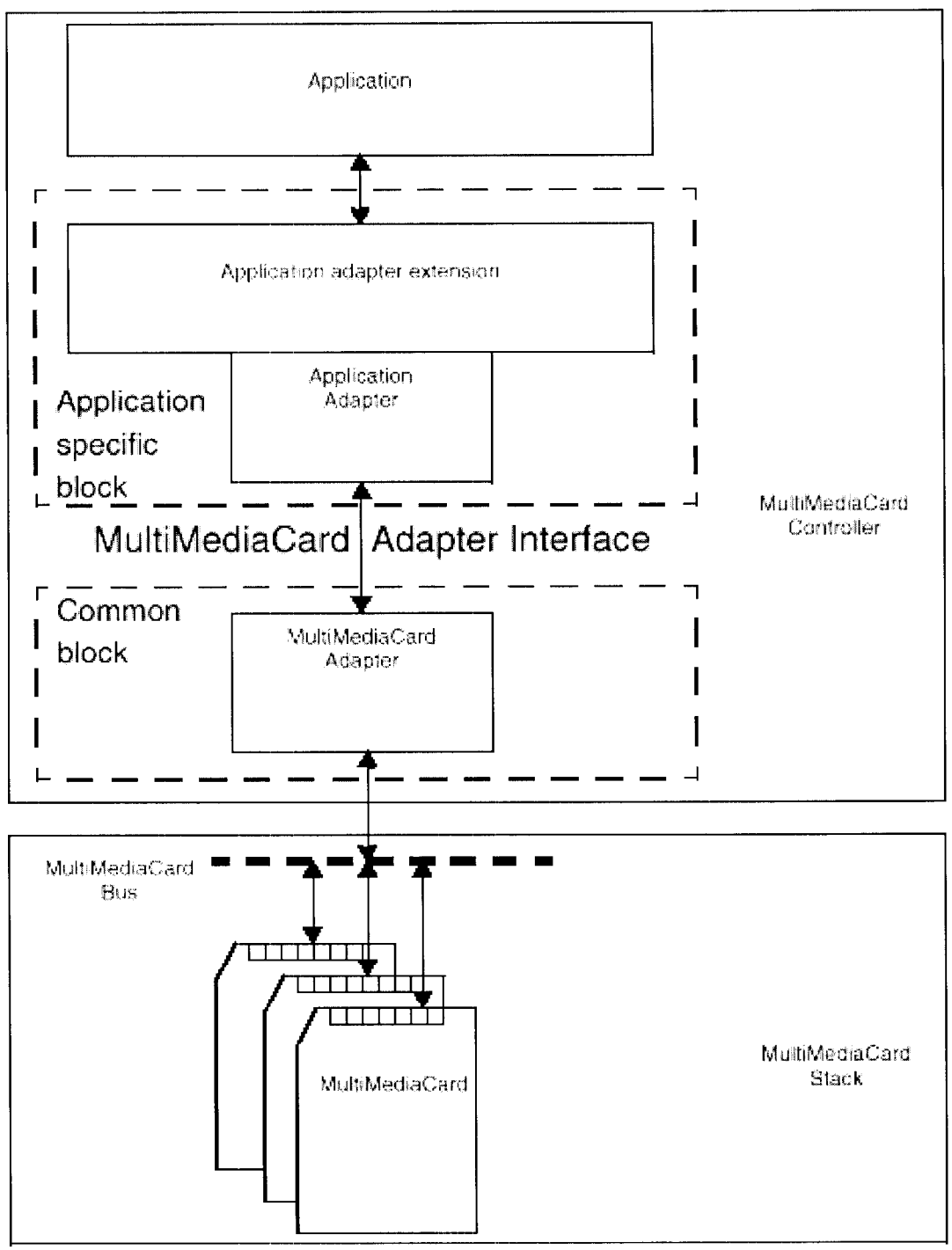
FIG. 5 illustrates the prior art physical partitioning of a generic MultiMediaCard system.
Figure 6B:
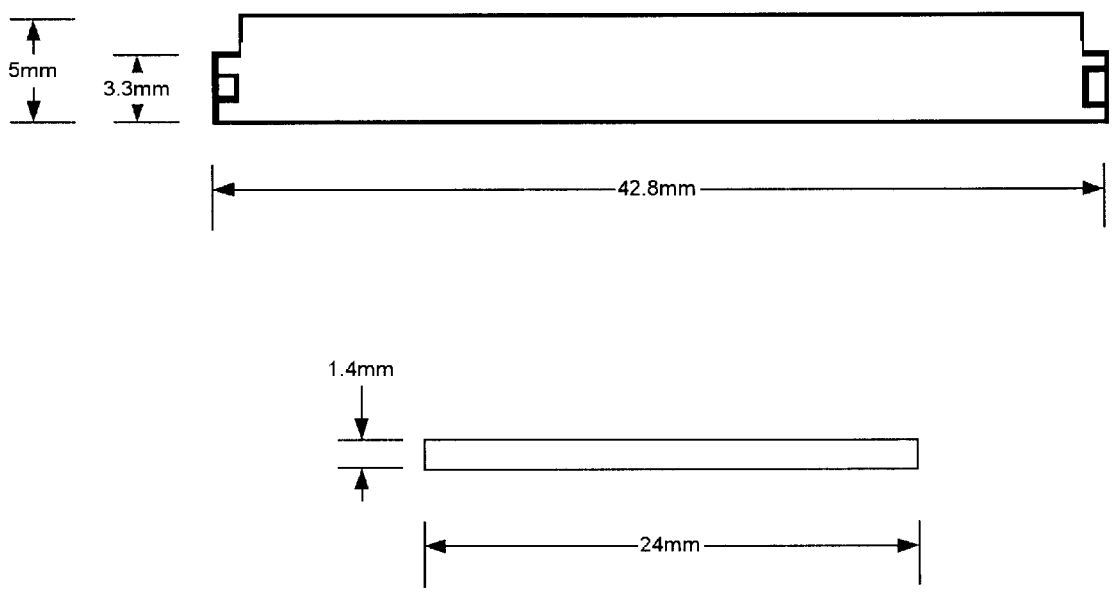

In preferred implementations of both of the first and second embodiments mentioned above, the functions performed by the removable memory are those of a MultiMediaCard adapter as illustrated in the MultiMediaCard adapter section of the MultiMediaCard system architecture diagram of FIG. 4. If the removable memory is being used to provide host-base memory expansion, such as described for the first embodiment, then the host must provide the functionality illustrated by the Application and Application Adapter sections of FIG. 4. If the removable memory is being used at least sometimes as an ancillary memory (at least sometimes private) to the application-specific circuitry contained on the expansion card, such as for the second embodiment, then the application-specific circuitry must provide the Application and Application Adapter section functionality, or else the application-specific circuitry must call on host services for such functionality.

Examples of known techniques for making and using other types of memory adapter circuitry for closed-case expansion cards or with flash memory are found in the previously referenced '145, '426, '584, '774, and '108 patents, among others. Examples of known techniques for making and using I/O adapter and application-specific circuitry for functions implemented in closed-case expansion cards and with flash memory are found in the previously referenced '374, '577, '774, and '108 patents, among others.

Frame Kit Assembly

The top and bottom frames may be composed of metal or plastic. In a preferred embodiment, the top and bottom frame portions each have a plastic base augmented with an outer metal plate over much of the interior region of the large panel surface of each portion. The metal plate extends to the edges of the panel at the connector ends of each portion and is attached to both connectors. In addition, smaller metal strips, or ears, on both sides at the finger-grip end (opposite to the host connector) extend from the plate to the edges of the panel and continue onto the sides. The frame kit is assembled and the side strips are sonically welded together on both sides of the casings. The welded strips and plates form a single continuous metal band around the top and bottom frames that permanently physically retains the assembled kit.

I/O Interconnect Options

I/O devices may be interconnected with the expansion card via three different embodiments. First, a PC-Card industry-standard Honda-style 15-pin connector may be used with a mating detachable cable. Detachable cables are preferred for light-duty applications where a continuous I/O device connection is neither needed nor desired. Second, a fully integrated fixed cable, having a molded strain relief may be used. Such a fixed cable maintains solid contact in high vibration environments, is protected against lateral stress, and seals out dust. Fixed cables are preferred for dedicated industrial or field applications. Third, at least a portion of the I/O device may be abutted and attached (often via a snap-in-place mechanism) directly to the expansion card, obviating the need for either a detachable or fixed cable. Cableless snap-on I/O devices are preferred for small mostly self-contained I/O devices that permit a compact PDA, expansion-card, I/O-device combination that handles physically as a single piece of equipment. In the instant invention, such snap-on I/O devices must make allowance for the removable memory.

PDA having Application Specific Card with Removable Media

Figure 7:
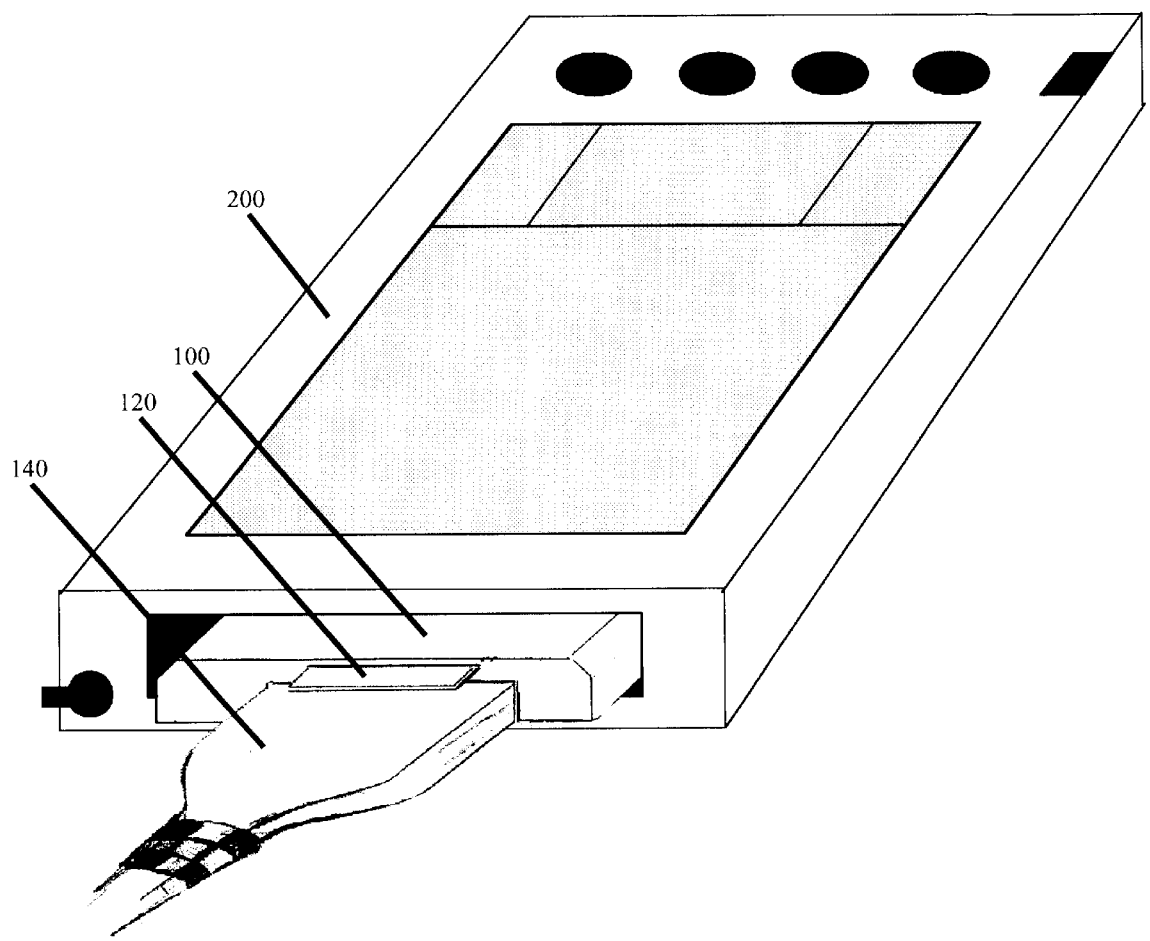
FIG. 7 illustrates a PDA equipped with a removable expansion card having both I/O and removable memory in accordance with the present invention.
Figure 8:
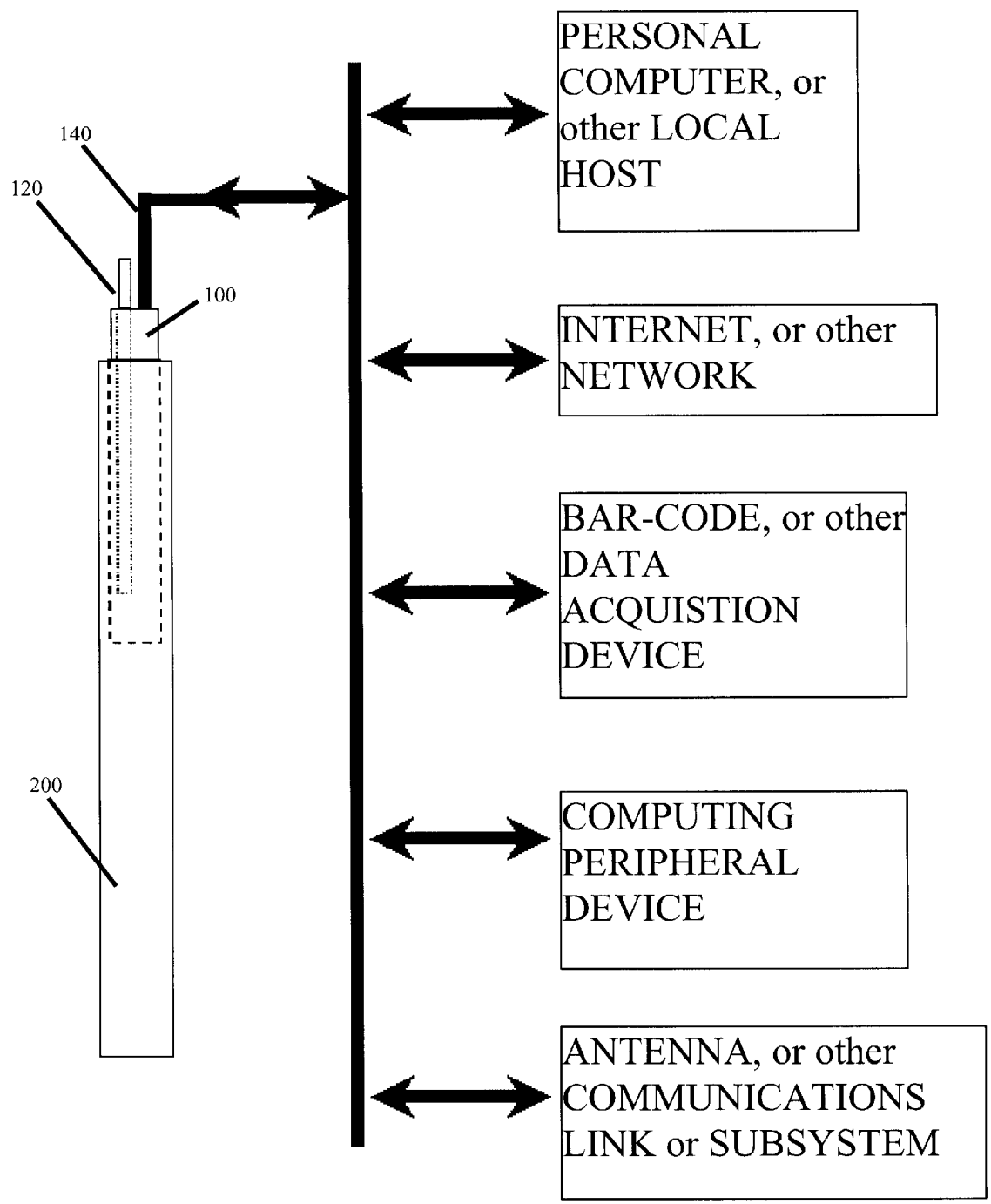
FIG. 8 illustrates some of the various types of I/O for which the PDA and removable expansion card of FIG. 7 may be equipped.

FIG. 7 illustrates a PDA 200 equipped with a removable expansion card 100 having both I/O interconnect 140 and removable memory 120 in accordance with the present invention. The application specific circuitry of the expansion card may be used in conjunction with application specific software running on the PDA. This permits the application specific circuitry of the expansion card to make use of the output (e.g., display, sound) and input (e.g., tablet, buttons, any I/O ports) capabilities of the PDA for user interface functions associated with the specific application. In particular the PDA's display/input-tablet provides for virtual controls and visual indicators for the application. FIG. 8 illustrates some of the various types of I/O for which the PDA and removable expansion card of FIG. 7 may be equipped. Application-specific functions may include special-function mixed-signal electronics, special-function I/O, special-function data-pumps, and special-function accelerators.

Application Specific Embodiments

Generic Removable Media Applications

The present invention enables general-purpose portable hosts to perform application-specific functions requiring dedicated ROM. A first large ROM-based application category is that of prerecorded media, such as music, audio, video, and text (for books, newspapers, and other publications). A second large ROM-based application category is customization for programmable devices, such as games, language translators, and other devices having "personality" modules.

The present invention also enables general-purpose portable hosts to perform application-specific functions requiring non-volatile read/write memory for data-capture, data-logging, data-checkpoints or backups, transaction logging, and data-transport.

In the illustrated embodiments the non-volatile read/write memory is flash memory in accordance with the standard MultiMediaCard. Such removable flash-memory-based application-specific functions have particular utility to medical and other data acquisition, secure commerce, financial and personal productivity devices making use of unique removable memories for each of multiple individuals, projects, or accounts.

The removable flash-based memory is also well suited where "sneaker-net" is a viable data transport. Provided manual/user intervention is acceptable, and depending on the speed of data link I/O incorporated into the expansion card, the physical transport of a removable memory device between a PDA-based expansion card and an external system may provide the best solution to fast local transport of large data-sets. For similar reasons, the use of removable memory devices may provide the best solution to rapidly reconfiguring an application-specific expansion card to initiate a large program or use a large data sets. The use of labeled, color-coded, or otherwise distinctive, removable memory devices also may provide the best solution for ease of use for users needing to select a particular program or data set from many for reconfiguring an application specific expansion card.

Specific Application Examples

Media Player Application

The present invention permits a general purpose PDA to be customized (specially adapted) for use as a portable/wearable media player, at the highest-level of functionality not unlike a portable Compact Disk player. Such a player uses the removable memory to store and playback digitally encoded media such as music, audio, or video. In a preferred embodiment the player makes use of the MPEG Layer 3 standard for digital audio encoding, generally known as MP3. Another embodiment makes use of the Microsoft Digital Audio standard. Other aspects of a preferred embodiment include an integral AM/FM receiver, a connector for a headset with an integral antenna for the receiver, and an auto-start on insert feature that initiates the media playback upon insertion of the removable memory. The PDA's display/input-tablet provides the virtual controls and visual indicators for the media player.

Module For Subscriber Services

In accordance with the present invention, an expansion card having I/O and removable memory is inserted into a computer host. The I/O is coupled to a receiver capable of receiving a large number of broadcast messages and services. The removable memory contains subscriber services information for each individual user. The expansion card uses the subscriber services information to filter out messages and services not applicable to the present status of the subscriber. The PDA's display/input-tablet provides the virtual controls and visual indicators for the display and access of captured messages and services.

Bar-Code Scanning Application (a Backup Storage Example)

In accordance with the present invention, an expansion card having I/O and removable memory is inserted into a computer host, a bar-coding peripheral is connected to the I/O portion of the card, and a removable memory card is inserted into the memory slot of the card. After each scan the scanned information is transferred through the I/O connection to the host computer for processing. Additionally, a backup copy of the scanned information is stored on the removable memory. Should the computer host fail or should the operator need to verify scans, the backup can be interrogated with the same or a different host.

Personal Environmental and Medical Monitoring Devices

The present invention permits a general purpose PDA to be customized as a portable/wearable personal environmental monitor. Equipped with the appropriate sensors and application-specific circuitry for sensor signal processing, such a device performs time-stamped data logging of environmental attributes such as ionizing radiation, temperature, and humidity. Similarly, a portable/wearable personal medial monitor data logs health-related attributes such as pulse, temperature, respiration, and blood pressure. The PDA's display/input-tablet provides the virtual controls and visual indicators for the monitoring devices.

Automotive and Industrial Diagnostic Monitoring and Control

The combined I/O interconnect and removable memory of the present invention also permits a general purpose PDA to be customized (specially adapted) for use as a data logging diagnostic monitor or time-based control device. It is known that the diagnostic connectors of certain vehicles can be adapted to interface with PDAs for real-time monitoring of critical vehicle subsystems. The present invention permits such diagnostic monitoring data to be communicated via the I/O interconnect and logged to the removable memory. Such a tool facilitates tracking subsystem performance over extended periods of time, and permits real-time and deferred graphics of time-varying system performance attributes. The PDA's display/input-tablet provides the virtual controls and visual indicators for the diagnostic monitor.

Conclusion

Although the present invention has been described using particular illustrative embodiments, it will be understood that many variations in construction, arrangement and use are possible within the scope of the invention. For example the number of I/O interconnects, removable memories, contact fingers, number and type of application-specific circuits, and the size, speed, and type of technology used may generally be varied in each component of the invention. The invention is not limited to the standard CompactFlash form factor, but other closed-case removable expansion card form factors are equally applicable. Nor is the invention limited to use of the standard MultiMediaCard, as other types of removable memory or media may also be employed. Functionally equivalent techniques known to those skilled in the art may be employed instead of those illustrated to implement various components. The present invention is thus to be construed as including all possible modification and variations encompassed within the scope of the appended claims.

We claim:

1. A removable expansion module for operation in a first slot of a portable host and in conjunction with other components including a removable memory and a bar-coding peripheral, the removable expansion module comprising:
   an expansion module frame and PCB;
   I/O adapter circuitry and I/O interconnect compatible with the bar-coding peripheral, the I/O interconnect providing first information transfers between the bar-coding peripheral and the module;
   a second slot for the removable memory;
   removable memory adapter circuitry for providing second information transfers with the removable memory; and
   wherein at least some of the information transfers include bar code related information, the first and second slot are respectively a first-level and second-level slot, the module is a first-level module coupled to the portable host via the first-level slot, the removable memory is a second-level module coupled to the first-level module via the second-level slot, and the second information transfers include transferring information between the first-level module and the second-level module.

2. The module of claim 1, wherein the module is physically and electrically compatible with the CompactFlash industry standard.

3. The module of claim 1, wherein the second slot for the removable memory is compatible with a MultiMediaCard, and the removable memory adapter circuitry is MultiMediaCard adapter circuitry.

4. The module of claim 1, wherein the module is designed to abut and fasten with at least part of the bar-coding peripheral such that the JIG-interconnect for coupling with the bar-coding peripheral is cableless.

5. The module of claim 1, further including bar code application-specific circuitry, and wherein the removable memory is a private memory for the application-specific circuitry, the management of the removable memory being an ancillary function to the primary function of the specific application.

6. The module of claim 5, wherein the I/O circuitry is coupled to the bar code application-specific circuitry and is not directly coupled to the portable host.

7. The module of claim 1, wherein at least some of the first information transfers include bar code related information.

8. The module of claim 1, wherein at least some of the second information transfers include bar code related information.

9. The module of claim 8, wherein at least some of the bar code related information is written to the removable memory.

10. The module of claim 9, wherein the information written to the removable memory corresponds at least in part to bar code related information provided via the first information transfers.

11. The module of claim 8, wherein at least some of the bar code related information is read from the removable memory.

12. The module of claim 1, further including first-level slot interconnect, the first-level slot interconnect providing third information transfers between the first-level module and the portable host, and wherein at least some of the third information transfers include bar code related information.

13. The module of claim 12, wherein the bar code related information included in the third information transfers corresponds at least in part to bar code related information provided via the first information transfers.

14. The module of claim 12, wherein the bar code related information included in the third information transfers corresponds at least in part to information read from the removable memory.

15. The module of claim 14, wherein the information read from the removable memory corresponds at least in part to bar code related information previously provided via the first information transfers.

16. A method of customizing a PDA for bar code scanner functions, the method comprising:
   providing the PDA, the PDA having display and input devices and a first slot;

providing the first slot with an expansion module having a second slot, application-specific circuitry for implementing at least part of the bar code scanner functions, and removable memory adapter circuitry;

providing the second slot with a removable memory, the removable memory adapter circuitry reading from and writing to the removable memory in accordance with the bar code scanner functions;

providing application software for the PDA to provide user interface related bar code scanner functions using the display and input devices of the PDA;

providing an I/O device for generating bar code related information, providing an I/O adapter compatible with the I/O device, the I/O adapter being integral to the expansion module;

providing I/O coupling from the I/O adapter to the I/O device, and transferring the bar code related information between the I/O device and the I/O adapter; and wherein the PDA is a portable host, the first and second slot are respectively a first-level and second-level slot, the expansion module is a first-level module coupled to the portable host via the first-level slot, the removable memory is a second-level module coupled to the first-level module via the second-level slot, and the reading and writing operations include transferring information between the first-level module and the second-level module.

17. The method of claim 16, further including transferring bar code related information between the first-level module and the PDA.

18. The method of claim 16, wherein at least part of the I/O device is abutted and fastened to the expansion module such that the I/O coupling is cableless.

19. The method of claim 16, wherein the information transferred between the first-level module and the second-level module includes bar code related information.

20. The method of claim 19, wherein at least some of the bar code related information is written to the removable memory.

21. The method of claim 20, wherein the information written to the removable memory corresponds at least in part to bar code related information provided to the I/O adapter by the I/O device.

22. The method of claim 19, wherein at least some of the bar code related information is read from the removable memory.

23. The method of claim 17, wherein the bar code related information included in the transfers between the first-level module and the PDA corresponds at least in part to bar code related information provided by the I/O device.

24. The method of claim 17, wherein the bar code related information included in the transfers between the first-level module and the PDA corresponds at least in part to information read from the removable memory.

25. The method of claim 24, wherein the information read from the removable memory corresponds at least in part to bar code related information previously provided by the I/O device.

26. A method of performing data transfers in a portable computing system, the method comprising:

providing a first portable computing host having a first slot including an associated first first-level expansion interface;

providing an external bar code scanner I/O device;

inserting a first first-level expansion module into the first slot and operatively coupling the first first-level expansion module to the first first-level expansion interface, the first first-level expansion module having a first-level I/O interface compatible with the bar code scanner I/O device, and a second slot including an associated first second-level expansion interface;

coupling the bar code scanner I/O device to the first-level I/O interface;

inserting a second-level expansion module having expansion memory into the second slot and operatively coupling the second-level expansion module to the first second-level expansion interface;

performing first data transfers over the first first-level expansion interface, the first data transfers being between the first portable computing host and the first first-level expansion module;

performing second data transfers over the first-level I/O interface, the second data transfers being and between the first first-level expansion module and the bar code scanner I/O device; and performing third data transfers over the first second-level expansion interface, the third data transfers being between the first first-level expansion module and the second-level expansion module.

27. The method of claim 26, further comprising:

storing a backup copy of at least a portion of the data contained in the second data transfers to the expansion memory of the second-level expansion module.

28. The method of claim 27, further comprising:

reading at least a portion of the backup copy from the expansion memory.

29. The method of claim 28, wherein the reading is performed while the second-level expansion module is inserted in the first first-level expansion module, and the first first-level expansion module is inserted in the first portable computing host.

30. The method of claim 28, further comprising:

providing a second portable computing host having a third slot including an associated second first-level expansion interface;

removing the first first-level expansion module from the first portable host;

after removing the first first-level expansion module, then inserting the first first-level expansion module into the third slot and operatively coupling the first first-level expansion module to the second first-level expansion interface; and wherein
the storing of the backup copy is performed while the first first-level expansion module is inserted in the first slot, and
the reading is performed while the first first-level expansion module is inserted into the third slot.

31. The method of claim 28, further comprising:

providing a fourth slot associated with an expansion interface compatible with the second-level expansion module;

removing the second-level expansion module from the second slot;

after removing the second-level expansion module, then inserting the second-level expansion module into the fourth slot and operatively coupling the second-level expansion module to the compatible expansion interface; and wherein
   the storing of the backup copy is performed while the second-level expansion module is inserted in the second slot, and
   the reading is performed while the second-level expansion module is inserted into the fourth slot.

32. The method of claim 31, wherein the fourth slot and associated expansion interface are included in a PC.

33. The method of claim 31, wherein the fourth slot and associated expansion interface are included in a PDA.

34. The method of claim 27, wherein the second data transfers include scanned bar code information.

35. A removable expansion module for operation in a first slot of a portable host and in conjunction with other components including a removable memory and a bar code scanner, the removable expansion module comprising:
   an expansion module frame and PCB,
      the module having I/O circuitry compatible with the scanner,
      the module having I/O interconnect compatible with the scanner, the I/O interconnect providing first information transfers between the scanner and the module,
      the module having a second slot for the removable memory,
      the module including removable memory adapter circuitry for providing second information transfers with the removable memory,
      the first and second information transfers including scanner data; and
   wherein the first and second slot are respectively a first-level and second-level slot,
   the module is a first-level module coupled to the portable host via the first-level slot,
   the removable memory is a second-level module coupled to the first-level module via the second-level slot, and
   the second information transfers include transferring information between the first-level module and the second-level module.

36. The module of claim 35, wherein the first information transfers include scanned bar code information.

37. The module of claim 35, wherein the second information transfers include bar code related information.

38. The module of claim 37, wherein at least some of the bar code related information is written to the removable memory.

39. The module of claim 38, wherein the information written to the removable memory corresponds at least in part to scanned bar code information provided via the first information transfers.

40. The module of claim 37, wherein at least some of the bar code related information is read from the removable memory.

41. The module of claim 35, further including first-level slot interconnect, the first-level slot interconnect providing third information transfers between the first-level module and the portable host, and wherein at least some of the third information transfers include bar code related information.

42. The module of claim 41, wherein the bar code related information included in the third information transfers corresponds at least in part to scanned bar code information provided via the first information transfers.

43. The module of claim 41, wherein the bar code related information included in the third information transfers corresponds at least in part to information read from the removable memory.

44. The module of claim 43, wherein the information read from the removable memory corresponds at least in part to scanned bar code information previously provided via the first information transfers.

\* \* \* \* \*